United States Patent [19]

Windsheimer

[11] Patent Number: 6,078,870
[45] Date of Patent: Jun. 20, 2000

[54] ELECTRICITY METER WITH MULTIPLEXERS FOR MONITORING MEASUREMENT CHANNELS

[75] Inventor: Klaus Windsheimer, Spalt, Germany

[73] Assignee: Siemens Aktiengesellschaft, Munich, Germany

[21] Appl. No.: 09/010,169

[22] Filed: Jan. 21, 1998

Related U.S. Application Data

[63] Continuation of application No. PCT/DE96/01280, Jul. 15, 1996, abandoned.

[30] Foreign Application Priority Data

Jul. 21, 1995 [DE] Germany .......................... 195 26 723

[51] Int. Cl.$^7$ .................................................. G01R 17/00
[52] U.S. Cl. ................................ 702/61; 702/60; 702/64; 324/118; 324/140 R
[58] Field of Search ................................ 702/58, 60–62, 702/64, 65, 75, 116, 117, 106, 107, 190, 124, 126, 182–185, 189, 197–199, FOR 103, FOR 104, FOR 164, FOR 106–FOR 108, FOR 167; 364/528.27–528.29; 324/74, 170 R, 141, 142, 73.1, 76.11, 118, 113, 115, 116, 76.59; 340/870.02, 870.21, 870.16–870.18; 708/313, 316, 523, 670, 605, 650; 710/69; 712/36; 341/77, 110, 155, 126, 122, 143, 180; 332/101, 103, 117, 144, 127, 106

[56] References Cited

U.S. PATENT DOCUMENTS

| | | | |
|---|---|---|---|
| 5,301,121 | 4/1994 | Garverick et al. | 702/60 |
| 5,345,409 | 9/1994 | McGrath et al. | 702/60 |
| 5,485,393 | 1/1996 | Bradford | 702/60 |

FOREIGN PATENT DOCUMENTS

| | | |
|---|---|---|
| 0575622A1 | 12/1993 | European Pat. Off. . |
| 063462A1 | 1/1995 | European Pat. Off. . |
| 4021522A1 | 1/1991 | Germany . |

OTHER PUBLICATIONS

"A Programmable Mixed–Signal ASIC for Power Metering", Garverick et al., IEEE, 1991, pp. 2008–2015, (Dec. 1991).

*Primary Examiner*—Hal Wachsman
*Attorney, Agent, or Firm*—Herbert L. Lerner; Lurence A. Greenberg

[57] ABSTRACT

An electricity meter includes measurement channels. In order to permit an extensive self monitoring of the measurement channels, input signals, in particular detected current signals and voltage signals, are detected in a double manner through different signal channels with sigma delta modulators. A plausibility monitoring of the detected signals takes place in a following digital signal processing device, wherein a corresponding error signal is generated depending on the type of malfunction or signal deviation.

15 Claims, 1 Drawing Sheet

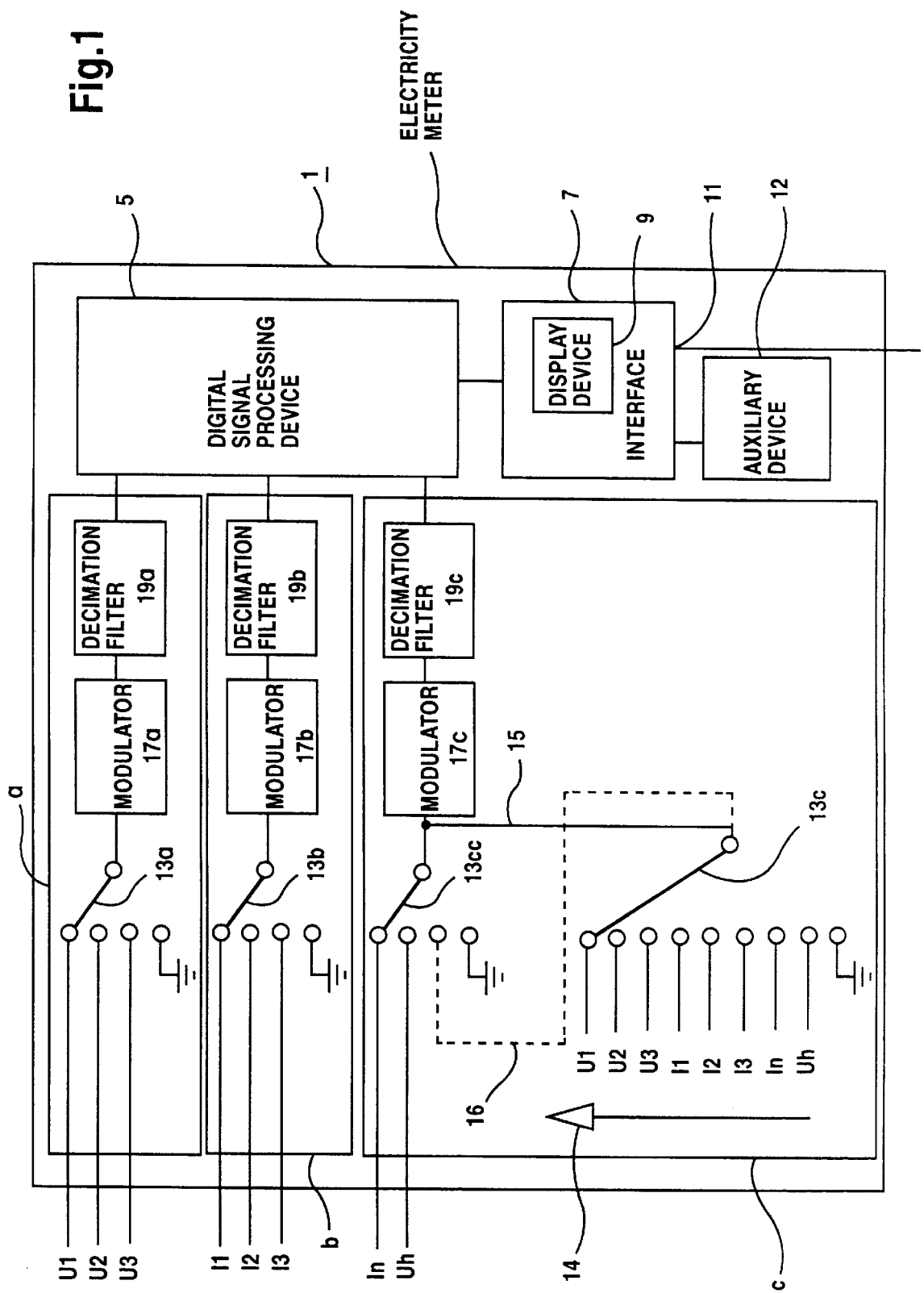

ELECTRICITY METER WITH MULTIPLEXERS FOR MONITORING MEASUREMENT CHANNELS

CROSS-REFERENCE TO RELATED APPLICATION

This application is a continuation of International Application Ser. No. PCT/DE96/01280, filed Jul. 15, 1996, which designated the United States, now abandoned.

BACKGROUND OF THE INVENTION

1. Field of the Invention

The invention relates to an electricity meter which has sigma delta modulators and a digital signal processing device.

German Published, Non-Prosecuted Patent Application DE 40 21 522 A1, corresponding to U.S. Pat. No. 4,943,888, has disclosed an electronic switch which includes a sigma delta modulator ($\Sigma\Delta$ modulator) for each network phase to be detected and in which the modulator is followed by a decimation filter. Outputs of the decimation filter are connected to one another through a switching logic having an output that is fed to an actuator for breaking the current supply. The switch serves to detect an excess of current and to switch off at a predetermined limit value. When there is a malfunction inside one of the signal channels, e.g. an interruption, it is possible that an excess current will not be detected so that it is also not possible for a triggering to occur.

Published European Patent Application 0 634 662 A1 has disclosed an electricity meter which has signal channels with multiplexers having inputs that are connected to current signals and voltage signals of a consumer, that are detected by converter. Furthermore, sigma delta modulators and a digital signal processing device are provided therein.

SUMMARY OF THE INVENTION

It is accordingly an object of the invention to provide an electricity meter, which overcomes the hereinafore-mentioned disadvantages of the heretofore-known devices of this general type and in which there is an extensive self monitoring for its measurement channels.

With the foregoing and other objects in view there is provided, in accordance with the invention, an electricity meter, comprising a digital signal processing device; and first, second and third signal channels fed to the digital signal processing device, each of the signal channels including a multiplexer having inputs for current and/or voltage signals received from an electrical consumer and detected by a converter; and a sigma delta modulator following the multiplexer; the first and second signal channels receiving the voltage or current signals, and the third signal channel receiving the same voltage or current signals and possibly other signals; and the digital signal processing device comparing data of equivalent signals made available by the different signal channels for generating a first error signal upon occurrence of a signal deviation exceeding a predetermined first value.

In this manner, malfunctions inside the individual measurement channels can be detected in a reliable manner. The signals associated with each of the different signal channels are used to form comparison values so that it is possible for there to be a plausibility control of the detected measurement values or signals. In this manner, it can be determined, for example, whether there is an internal or external malfunction, wherein through the use of logical connections in the digital signal processing device, it is possible, if need be, to perform a more precise limitation or localization of the malfunction. The redundancy in the signal detection through different signal channels achieves a high degree of reliability in the processing of measurement values. A failure of a channel is reliably detected.

In accordance with another feature of the invention, a broadening of signal processing is achieved by connecting a fourth multiplexer between the third multiplexer and the digital signal processing device with other inputs thereof being additionally supplied, if need be, with the other signals.

In accordance with a further feature of the invention, at least the first three multiplexers are also supplied with a ground or earth potential as an input signal. As a result, it is easily possible to detect an offset error of the respective measurement channel, in particular of the $\Sigma\Delta$ modulator.

In accordance with an added feature of the invention, an auxiliary voltage, an auxiliary current or neutral current, a temperature signal, or a voltage signal is provided as other signals. In the digital signal processing device, these signals can likewise be subjected to a measurement value monitoring or can be used as a comparison signal or reference for the other signals. As a result, other comparisons between signals are also possible, so that there is a favorable self monitoring of the meter through additional plausibility controls.

In accordance with an additional feature of the invention, the network frequency of the detected voltage signals is measured in the digital signal processing device with the aid of an oscillator, in particular a quartz oscillator. When a predetermined frequency limit value is exceeded, an error signal is generated. Usually, it can be assumed that the network frequency detected with the voltage is relatively constant and lies within particular limits. When there is an impermissibly large deviation of the measured network frequency from its reference value, the conclusion can therefore be drawn that there is a malfunction of the oscillator or in the running of the program in the digital signal processing device.

In accordance with yet another feature of the invention, a first sum of the current signals detected in the second signal channel is formed and is compared to a current limit value, and when the current limit value is exceeded, a third error signal is generated. As a result, asymmetries in the signal processing can be detected.

In accordance with yet a further feature of the invention, if need be, the neutral current can also be advantageously added to the first sum of currents. This is particularly favorable when used in countries in which the neutral current is accessible or should be measured.

In accordance with still another feature of the invention, the signal processing device forms a second sum of the current values supplied to the multiplexer of the third signal channel and if need be of a neutral current detected as another signal, for comparing the second sum to the first sum and generating a fourth error signal upon exceeding a predetermined sum limit value.

In accordance with yet an added feature of the invention, the multiplexers are synchronized with one another. As a result, it is possible for there to be a comparison of simultaneous measurement values or signals. This is particularly true for the generation of meter values in a consumption measurement and for the monitoring of the meter.

In accordance with yet an additional feature of the invention, the number of inputs of the respective multiplexers is adapted for the detection of three-phase network values, in accordance with a three-phase network.

In accordance with again another feature of the invention, there are provided decimation filters respectively connected between the ΣΔ modulators and the digital signal processing device. In this manner, bit streams emitted by the ΣΔ modulators are produced with the desired resolution, depending on requirements, as digital words for the further signal processing. For example, a high resolution or a rapid signal processing can be achieved depending on the structure of the filter. The decimation filter can be adjusted with software or hardware, which also provides other possible applications or application fields for the meter, if need be.

In accordance with a concomitant feature of the invention, a failure of one of the signal channels is detected in the digital signal processing device as a function of at least one of the error signals and in the case of a malfunction, the respectively malfunctioning signal is detected through one of the intact signal channels. As a result, it is possible to have a virtually interruption-free operation of the meter when there is a malfunction. The desired signal is simply detected through an intact signal channel and is supplied to the signal processing, so that there is no loss of consumption values to be detected.

Other features which are considered as characteristic for the invention are set forth in the appended claims.

Although the invention is illustrated and described herein as embodied in an electricity meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 1 is a block circuit diagram of an electricity meter according to the invention.

DESCRIPTION OF THE PREFERRED EMBODIMENTS

With reference to the drawing and the description thereof given below, it is seen that equivalent details are provided with equivalent reference numerals, and that equivalent details of different groups are differentiated from one another through the use of additional letters in accordance with a respective signal channel a, b, c.

Referring now in detail to the single figure of the drawing, there is seen a block circuit diagram of an electricity meter (meter 1), with first, second and third signal channels a, b, c that are connected to a mutual digital signal processing device 5, which is referred to below by the designation DS 5. A measurement value processing for consumption measurement and for other functions of the meter 1 is carried out in the DS 5. The DS 5 is preferably constructed as a digital signal processor. It can, however, also be constructed as a computing device with a microcomputer or as a hard-wired logic circuit. It is essential that a digital signal processing of the signals or data supplied by the signal channels a, b, c is possible.

If need be, the DS 5 is connected to yet another device 7 which contains a display device 9 and/or an interface 11. The device 7 can, for example, be constructed as a digital processing device with a microprocessor. It is also conceivable that the DS 5 and the device 7 constitute one component or are formed of a common component, in particular a computer. In particular, all of the components of the meter 1 shown in the figure can be combined on or in one component, in particular an IC or ASIC. If need be, the device 7 can also be associated with another device 12, which contains an auxiliary device required for operation, e.g. a memory, an oscillator, a computer, or an input/output device.

The first signal channel a is available as a voltage channel, the second signal channel b is constructed as a current channel, and the third signal channel c is constructed as a channel for other signals or auxiliary quantities. It is assumed in the present case that three-phase signals from a corresponding consumer or network are processed. Therefore, voltage signals U1 to U3 are supplied to the first signal channel a. The second signal channel b receives current signals I1 to I3 of the respective phases. It is correspondingly possible to use the meter with consumers that have more or less phases, if need be with corresponding adaptations.

Other signals In, Uh are connected to the third signal channel c. The other signals can be arbitrary signals to be monitored, e.g. a temperature signal or another voltage or current signal. In the figure, a neutral current In and a voltage Uh, for example, are supplied to the third signal channel c. In addition, the current signals and voltage signals I1 to I3 and U1 to U3 are also supplied to the third signal channel c. As a result, these signals are double detected or detected redundantly.

The respective above-mentioned signals are each supplied to inputs of a schematically illustrated first, second and third multiplexer 13a to 13c of each signal channel a, b, c. In a suitable manner, a parallel connection of signals to a number of multiplexers is realized through the use of internal wiring (schematically indicated by an arrow 14) in the meter 1, e.g. through the use of a corresponding wiring to a printed circuit board. Naturally, external wiring, e.g. to a terminal block, is also possible. The signal channel a will now be described below as an example for all of the signal channels a, b, c.

The first multiplexer 13a is followed by a ΣΔ modulator 17a for analog/digital conversion. Preferably, a decimation filter 19a is connected between the ΣΔ modulator 17a and the DS 5 in order to prepare a digital output signal of the ΣΔ modulator 17a for the DS 5. This can be eliminated in particular instances, or if need be, can be functionally contained in the DS 5.

The multiplexer 13a cyclically scans the voltage signals U1, U2, U3. The scanning is carried out with a sufficiently high frequency so that a corresponding resolution is assured. The scanning frequency can, for example, lie between 200 Hz and 20 kHz and preferably between 1 and 5 kHz.

The second signal channel b is identical in its structure to that of the first signal channel a. In contrast, the third signal channel c has a multiplexer 13c with a higher number of inputs so that it is possible to redundantly process the signals U1 to U3 and I1 to I3.

The third multiplexer 13c of the signal channel c can additionally be followed in a cascade manner by a fourth multiplexer 13cc. In this alternative, a connecting line 15 is then replaced by a line 16 shown in dashed form. The other signals Uh and In that are only supplied to the third multiplexer 13c can then be additionally supplied to the fourth multiplexer 13cc. As a result, there is also a virtually redundant signal processing for the other signals Uh and In, at least for a partial region. The respective schematically indicated inputs of the multiplexers 13c and 13cc which are respectively acted upon by the same signals are likewise connected in parallel for this purpose, as was already described above.

The multiplexers 13a to 13cc are preferably synchronized with one another so that later in the DS 5, a direct comparison of the redundantly detected signals can take place without phase shifting. An unsynchronized operation is also conceivable.

Then if need be in an instance like this, the respective digitized signals have to be temporarily stored and associated with one another, due to which the technical expenditure is increased slightly. In a comparison of effective values of the signals, a temporary storage is not necessary.

Alternatively, the respective multiplexers 13a to 13cc can additionally be supplied with a ground or earth potential as an input signal (which is represented in the figure as an earth symbol). In this manner, the measurement value deviation (offset) in the individual signal channels a to c can be easily determined. The measurement error which is detected can then be used for comparison or correction in the signal processing. Preferably, the monitoring of the measurement value deviation can be carried out cyclically, through the use of which there is a constant self monitoring of the respective signal channels a to c. If necessary, the determination of a measurement error can also be used to produce a reply which signals a premature maintenance, calibration, or adjustment. The correction can be carried out, if need be, in the DS 5 or in the device 7.

The signals that are detected and pre-processed by the signal channels a to c are subsequently processed further in the DS 5. At the same time, different functions are preferably backed up as the program and realized in the DS 5.

Measurement Value Monitoring:

Important electrical signals, e.g. the current signals and voltage signals I1 to I3 or U1 to U3, are detected redundantly in the different signal channels a to c. Equivalent signals are then compared to one another in the DS 5 and tested for plausibility. The effective values of the voltage can be calculated at the same time, for example from the respective digital scanning values of the voltage signals U1 to U3. The scanning values are formed through the use of the $\Sigma\Delta$ modulators 17a 17c. If the effective values of the two signal channels (a and c in this example) differ from each other by a predetermined amount or by a predetermined limit value, then a first error signal is generated. It can then be assumed that at least one of the signal channels is malfunctioning.

This is the case, for example, when all signals of a signal channel differ from the signals of another signal channel. If a deviation is only present in one signal of one phase, then it can thus be concluded that at least the respective $\Sigma\Delta$ modulator and the respective decimation filter are operating correctly. An error source can then be the multiplexer, for example.

For example, the following errors can also be detected: A fracture of a bond wire, a defect of the voltage converter or the voltage divider, a fracture of the supply line, a defective internal wiring, or a defective connection of the meter.

Naturally, the required plausibility control is carried out for all signals connected to the input side. If necessary, a comparison of the voltage signals or current signals U1 to U3 or I1 to I3 with a reference value or auxiliary value which is connected to the third signal channel c can also take place. To that end, the voltage Uh can be used as a reference voltage, for example. The plausibility control can be realized as a program in the DS 5 or can also be realized as a concrete circuit or logic.

Frequency Monitoring:

The network frequency of the detected signals, particularly of the voltage signals U1 to U3, is measured with the aid of a quartz oscillator in the DS 5. If the network frequency should deviate from the reference frequency by a particular amount, for example 5%, then a second error signal is generated, in particular an error flag. The network frequency of three-phase networks can as a rule be regarded as very constant. If a considerable frequency deviation is determined in this case, it can be assumed that the quartz oscillator is malfunctioning. This can be used as a rough function control, wherein the error that can be detected in particular is one in which the quartz oscillator is vibrating at a harmonic.

Neutral Current Monitoring:

The current signals I1 to I3 are added up in the DS 5. In a 3-conductor meter, as a rule the sum of the currents must equal 0. If a predetermined limit value is exceeded in this case, then a third error signal is generated. If need be, in a 4-conductor meter, the neutral current In can also be added to the sum of currents. Naturally, this applies to networks in which the neutral current is also detected. In addition, a comparison of the current sum of the second signal channel b to the current sum of the third signal channel c can be carried out. As a result, a further monitoring is possible, wherein in the event of a malfunction, a fourth error signal is generated.

Other Functions

If necessary, in order to test current sensors that precede the multiplexers 13a to 13cc, another testing device can precede them so that this input region of the signal detection is also subject to monitoring. A testing of this kind can be carried out, for example, when the meter is read or can be repeated at fixed intervals. It is conceivable for the preceding testing device to carry out a data exchange with the meter 1 through the interface 11 so that an automatic and rapid function control is possible.

Another additional function can also be provided by virtue of the fact that when there is a failure of one of the signals of a phase or of a measurement conduit, an automatic changeover into an emergency operation takes place, wherein the malfunctioning signal is detected through another signal channel. If necessary, this changeover can be triggered as a function of one of the error signals mentioned above and is suitably realized in the logic already described above. This changeover is particularly of interest when there are internal malfunctions in the meter.

The extensive plausibility controls provide for a reliable error localization and improved operation guidance as compared to the prior art, since essential functions of the meter 1 are tested. The display or signaling of the error signals is carried out in a suitable manner by the display device 9 or through the interface 11.

Naturally, features of individual embodiments or variants can be combined with one another or exchanged with one another without going outside the basic concepts of the current idea. It is essential for this purpose that a redundant signal detection is used, which permits an error detection for the respective measurement channels and if need be, permits an auxiliary operation.

I claim:

1. An electricity meter, comprising:
    a digital signal processing device; and first second and third input signal channels connected to said digital signal processing device, each of said input signal channels including:
        multiplexer having inputs or signals received from an electrical consumer; and sigma delta modulator following said multiplexer, said first and second input signal channels receiving a plurality of signals, said third input signal channel receiving the plurality of signals and at least one other signal, each signal of the plurality of signals input to more than one of said first, second and third input signal channels generating equivalent signals fed to said digital signal processing device, and said digital signal processing device comparing data of the equivalent signals for generating a first error signal upon occurrence of a signal deviation of one of the equivalent signals exceeding a predetermined first value.

2. The electricity meter according to claim 1, including another multiplexer connected between said multiplexer of said third input signal channel and said digital signal processing device, said other multiplexer having other inputs to be supplied with signals from the plurality of signals and said at least one other signal.

3. The electricity meter according to claim 2, wherein said multiplexers of said first, second and third input signal channels also receive a ground or earth potential as an input signal.

4. The electricity meter according to claim 1, wherein said it least one other signal is a signal selected from the group consisting of an auxiliary voltage, an auxiliary current or neutral current, a temperature signal and a voltage signal.

5. The electricity meter according to claim 1, wherein said digital signal processing device measures a network frequency of the detected signals with an oscillator for generating a second error signal upon exceeding a predetermined frequency limit value.

6. The electricity meter according to claim 5, wherein said oscillator is a quartz oscillator.

7. The electricity meter according to claim 5, wherein said plurality of signals includes a plurality of current signals and said digital signal processing device forms a first sum of the plurality of current signals detected in said second signal channel, for comparing the first sum to a current limit value and generating a third error signal upon exceeding the current limit value.

8. The electricity meter according to claim 7, wherein a neutral current is also added to the first sum of the plurality of current signals.

9. The electricity meter according to claim 7, wherein said digital signal processing device forms a second sum of the plurality of current signals supplied so said multiplexer of said third input signal channel for comparing the second sum to the first sum and generating a fourth error signal upon exceeding a predetermined sum limit value.

10. The electricity meter according to claim 9, wherein a neutral current detected as another signal is also added to the second sum of the plurality of current signals.

11. The electricity meter according to claim 9, wherein said digital signal processing device detects a failure of one of said first, second and third input signal channels as a function of said first error signal and a malfunctioning signal is detected through another one of said first, second and third input signal channels in the event of a malfunction.

12. The electricity meter according to claim 9, wherein said digital signal processing device is adapted to generate the first error signal upon detecting a missing one of the equivalent signals from one of said first and second input signal channels, to interpret the missing one of the equivalent signals as a failure of a respective one of said first and second input signal channels based upon the first error signal, and to process the other one of the equivalent signal through said third input signal channel in place of the missing one of the equivalent signals.

13. The electricity meter according to claim 1, wherein said multiplexers are synchronized with one another.

14. The electricity meter according to claim 1, wherein said multiplexers have a number of inputs selected for the detection of three-phase measurement values.

15. The electricity meter according to claim 1, wherein each of said input signal channels has a decimation filter connected between a respective sigma delta modulator and said digital signal processing device.

* * * * *